United States Patent [19]

Nakajima

[11] Patent Number: 5,895,736

[45] Date of Patent: Apr. 20, 1999

[54] METHOD OF TRANSFERRING MINIATURE PATTERN BY USING ELECTRON BEAM LITHOGRAPHY SYSTEM WITHOUT PROXIMITY EFFECT

[75] Inventor: Ken Nakajima, Tokyo, Japan

[73] Assignee: NEC Corporation, Japan

[21] Appl. No.: 08/818,907

[22] Filed: Mar. 17, 1997

Related U.S. Application Data

[63] Continuation of application No. 08/425,426, Apr. 20, 1995, abandoned.

[30] Foreign Application Priority Data

Apr. 22, 1994 [JP] Japan ................................. 6-084234

[51] Int. Cl.⁶ .............................. G03C 5/00; G03F 9/00
[52] U.S. Cl. .......................... 430/30; 430/296; 430/396; 430/5; 430/942; 250/492.3
[58] Field of Search ............................ 430/5, 296, 396, 430/942, 30; 250/492.3

[56] References Cited

U.S. PATENT DOCUMENTS

| | | | |
|---|---|---|---|
| 4,393,127 | 7/1983 | Greschner et al. | 430/5 |
| 4,855,197 | 8/1989 | Zapka et al. | 430/5 |
| 4,957,835 | 9/1990 | Aden | 430/296 X |

FOREIGN PATENT DOCUMENTS

4-137520  5/1992  Japan.

*Primary Examiner*—Bernard Codd
*Attorney, Agent, or Firm*—Ostrolenk, Faber, Gerb & Soffen, LLP

[57] ABSTRACT

An electron beam lithography system radiates an electron beam uniform in beam current density through apertures formed in an aperture plate to an electron resist layer, and steps are formed in the outlet end portions of the apertures so as to decrease the beam current density of a peripheral portion of the incident electron beam, thereby preventing the electron resist layer from the proximity effect.

5 Claims, 6 Drawing Sheets

METHOD OF TRANSFERRING MINIATURE PATTERN BY USING ELECTRON BEAM LITHOGRAPHY SYSTEM WITHOUT PROXIMITY EFFECT

This is a continuation of application Ser. No. 08/425,426 filed on Apr. 20, 1995 now abandoned.

FIELD OF THE INVENTION

This invention relates to an electron beam lithography and, more particularly, to a method of transferring a miniature pattern by using an electron beam lithography system.

DESCRIPTION OF THE RELATED ART

Electron beam lithography directly writes a miniature pattern into an electron resist layer with an electron beam, and achieves resist pattern geometries smaller than 1 micron. In view of the pattern geometries, an electron beam lithography is superior to an optical lithography which carries out a pattern transfer by using a light radiation passing through a reticle. Another attractive point of electron beam lithography is pattern writing without a reticle. However, the throughput of electron beam lithography does not economically compete with the throughput of optical lithography.

In order to improve the throughput of electron beam lithography, a target miniature pattern to be written in a single radiation field is divided into a plurality of miniature sub-patterns, and the miniature sub-patterns are concurrently written into an electron resist layer. The miniature sub-patterns are merged with one another, and compose the target miniature pattern.

In the electron beam lithography system available in the prior art electron beam lithography, an electron gun radiates an electron beam through a first shaping aperture plate, and the electron beam is shaped into a rectangular flux that has a uniform in current dispersion. Two shaping lens units focus the rectangular flux of the electron beam on a second shaping aperture plate, and, thereafter, the electron beam passes through a demagnification lens and an objective lens. The electron beam finally falls onto an electron resist layer, and a deflector moves the electron beam on the electron resist layer.

Figure 1:
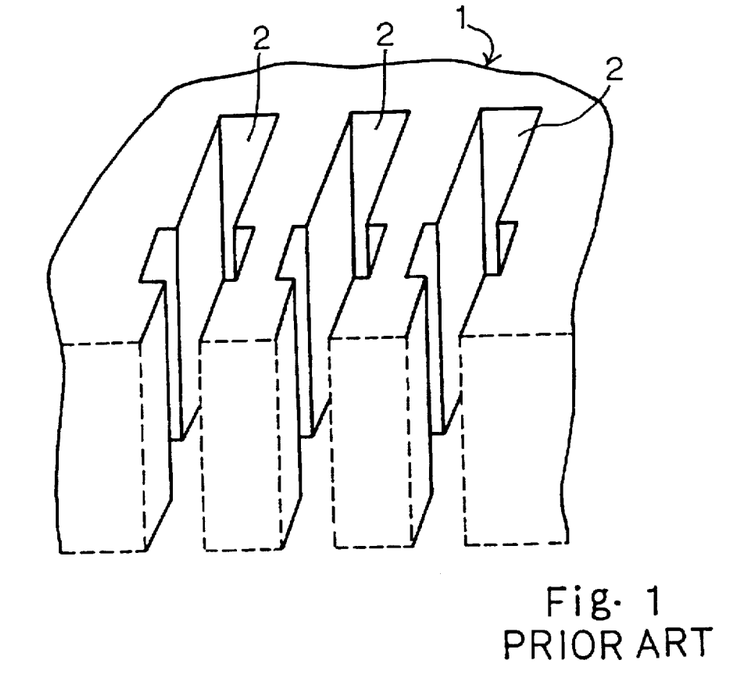
FIG. 1 is a perspective view showing the second aperture plate provided in the prior art electron beam lithography system.

FIG. 1 illustrates a part of the second shaping aperture plate 1. The second shaping aperture 1 is formed from a silicon substrate, and a plurality of generally rectangular openings 2 are formed in the second shaping aperture plate 1. The plurality of generally rectangular openings 2 form a pattern image to be transferred to the electron resist layer.

The electron beam passes through the plurality of generally rectangular openings 2, and the image of generally rectangular openings is transferred through the demagnification lens and the objective lens to the electron resist layer.

Figure 2:
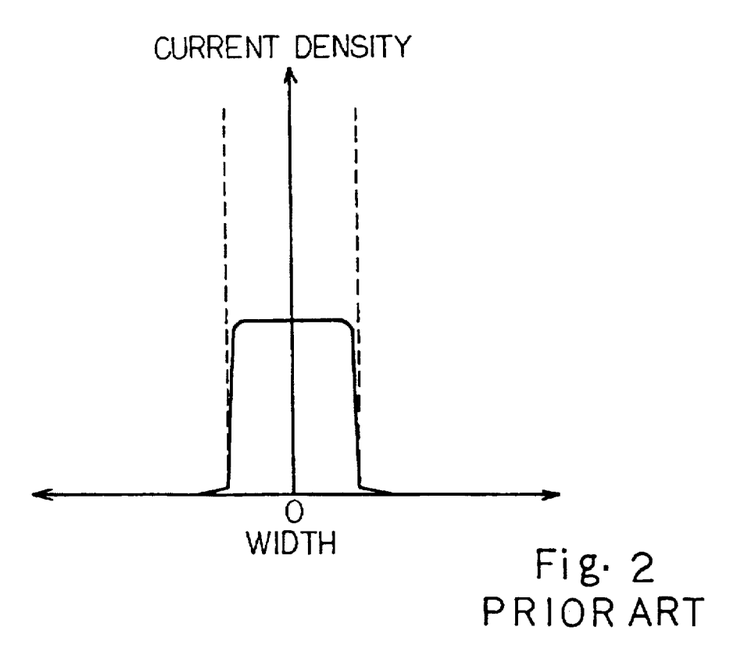
FIG. 2 is a graph showing the current density of the electron beam passing through the generally rectangular opening formed in the second aperture.

FIG. 2 shows a dispersion of current density of the electron beam passing through one of the generally rectangular openings 2. The dispersion of current density is identical with those of the other generally rectangular openings 2, and the proximity effect deteriorates the transferred pattern image. In other words, the pattern image on the second aperture plate 1 is not exactly transferred onto the electron resist layer, and a difference takes place between the pattern image on the second aperture plate 1 and the resist pattern developed after the pattern transfer.

A proximity effect correction technique is disclosed in Japanese Patent Publication of Unexamined Application No. 4-137520. According to the Japanese Patent Publication of Unexamined Application, a third aperture plate is added to the prior art electron beam lithography system.

The third aperture plate is provided over the second aperture plate 1, and modifies a local current density of the electron beam incident into the second aperture plate 1. more specifically, a plurality of screen areas are formed in the third aperture plate, and the screen areas respectively correspond to the generally rectangular openings 2. The screen areas are different in mesh, and the geometries of the mesh are smaller than the resolution. The screen areas modify the local current density of the electron beam passing therethrough, and electron sub beams different in current density are incident into the generally rectangular openings 2. Thus, the third aperture plate appropriately regulates the local current densities of the electron sub beams, and corrects the proximity effect.

However, a problem is encountered in the prior art electron beam lithography in that the third aperture plate consumes time, labor and cost. Namely, when a new second aperture plate is required, the manufacturer measures the proximity effect of the pattern image on the new second aperture plate, and tailors a new third aperture plate in such a manner that the geometries of mesh are smaller than the measured proximity effect.

Another problem inherent in the prior art electron beam lithography is an exact alignment between the screen areas and the generally rectangular openings 2, and the exact alignment system is expensive and time consuming.

Yet another problem is dust particles clogging the screens and/or deflecting electrons. While the electron beam lithography system is transferring a pattern image to a second aperture plate, a set of another second aperture plate and another third aperture plate is maintained in a clean space. However, dust particles are liable to adhere to the screen areas. Even though the dust particles do not clog the meshes, the dust particles are charged in the electron beam radiation, and the charged dust particles deflect the electron sub beams. The deflected electron sub beams deteriorate the pattern image on the electron resist layer.

SUMMARY OF THE INVENTION

It is therefore an important object of the present invention to provide an electron beam lithography which is free from the problems inherent in the prior art electron beam lithography.

To accomplish the object, the present invention proposes to control a profile of beam current density incident into an electron resist layer.

In accordance with one aspect of the present invention, there is provided a method of forming a pattern in a target area by radiating an electron beam from an electron beam gun through a rectangular aperture formed in a first aperture plate, allowing the electron beam to fall onto one of aperture patterns formed in a second aperture plate, an edge portion of the second aperture plate defining an step projecting into the aforesaid one of the aperture patterns closer to an outlet end than an inlet end, and causing the electron beam partially passing through the aforesaid one of the aperture patterns and partially transmitted through the step to be incident onto the target area.

In accordance with another aspect of the present invention there is provided a method of forming a pattern in an electron resist layer, comprising the steps of: selecting an aperture plate having the pattern formed by at least one aperture, a projecting portion of the aperture plate making an outlet end portion of the at least one aperture narrower than the inlet end portion of the aforesaid at least one aperture; installing the aperture plate in a path for an electron beam between an electron beam gun and the electron resist layer; and radiating an electron beam uniform in beam current density through the aforesaid at least one aperture to the electron resist layer, the electron beam incident into the electron resist layer partially passing through the outlet end portion and partially transmitted through the projecting portion so that a beam current density is rather small in a peripheral area than in a central area.

BRIEF DESCRIPTION OF THE DRAWINGS

The features and advantages of the electron beam lithography according to the present invention will be more clearly understood from the following description taken in conjunction with the accompanying drawings in which.

DESCRIPTION OF THE PREFERRED EMBODIMENTS

First Embodiment

Figure 3:
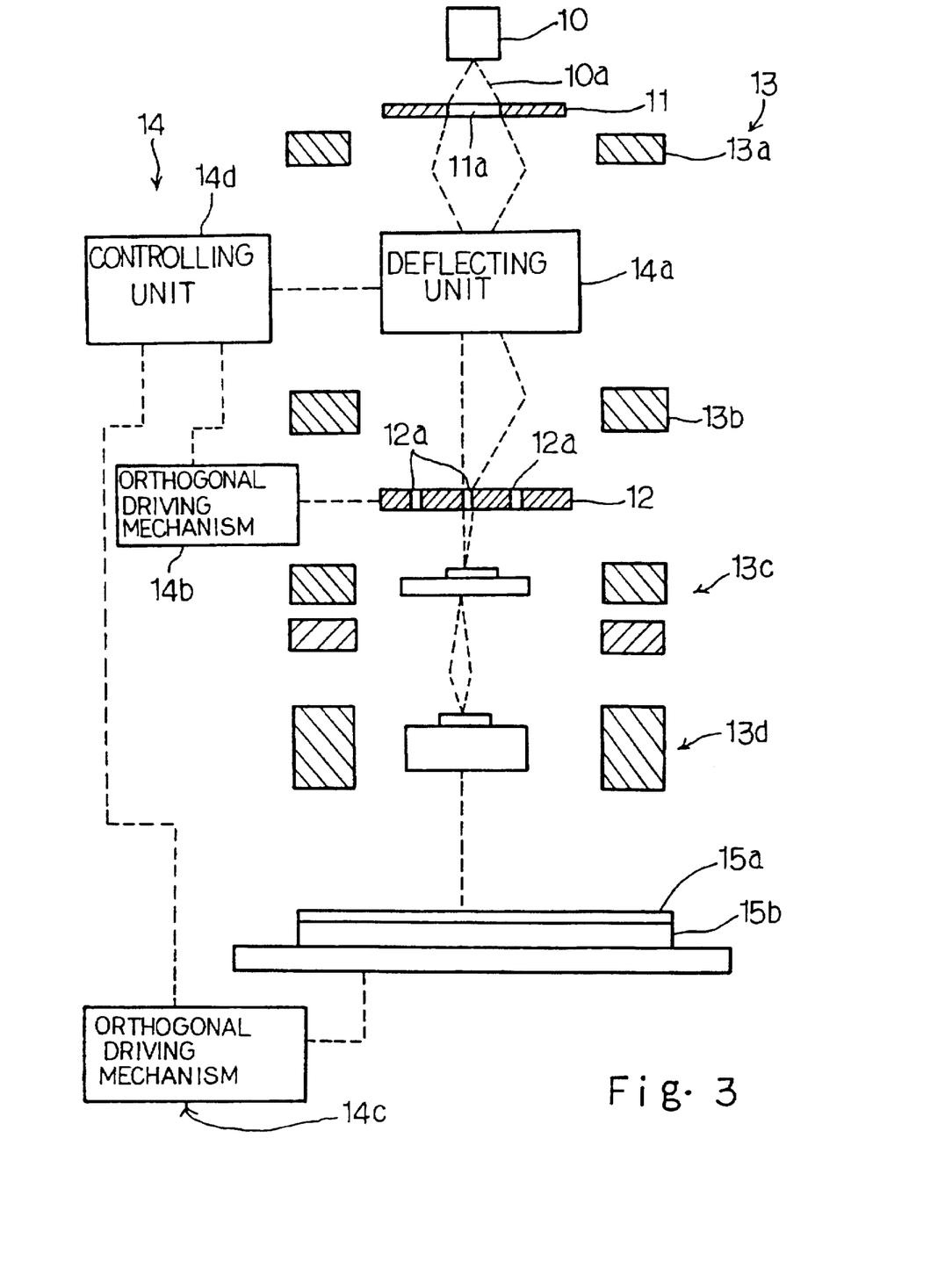
FIG. 3 is a perspective view showing an electron beam lithography system according to the present invention.

Referring to FIG. 3 of the drawings, an electron beam lithography system embodying the present invention essentially comprises an electron beam gun 10, first and second aperture plates 11 and 12, a lens sub-system 13 and a controlling sub-system 14. Though not shown in FIG. 3, the electron beam gun 10, the first and second aperture plates 11 and 12, the lens sub-system 13 and parts of the controlling sub-system 14 are placed in a vacuum chamber. The electron beam gun 10 radiates an electron beam 10a, and the electron beam 10a falls onto an electron resist layer 15a covering a semiconductor wafer 15b through the first and second aperture plates 11 and 12 and the lens sub-system 13.

The first aperture plate 11 is provided under the electron beam gun 10, and a rectangular aperture 11a is formed in the first aperture plate 11. The electron beam 10a passes through the rectangular aperture 11a, and the rectangular aperture 11a makes the current density of the electron beam 10a uniform. The second aperture plate 12 is an important part, and will be described herein later in detail.

The lens sub-system 13 includes shaping lens units 13a and 13b provided between the first and second aperture plates 11 and 12, a demagnification lens unit 13c provided under the second aperture plate 12 and an objective lens unit 13d provided between the demagnification lens unit 13c and the electron resist layer 15a. The shaping lens units 13a and 13b, the demagnification lens unit 13c and the objective lens unit 13d are well known to a person skilled in the art, and no further description is incorporated hereinbelow.

The controlling sub-system 14 comprises a deflecting unit 14a provided between the shaping lens units 13a and 13b, an orthogonal driving mechanism 14b associated with the second aperture plate 12, an orthogonal driving stage 14c mounting the semiconductor wafer 15b and a controlling unit 14d for controlling the deflecting unit 14a, the orthogonal driving mechanism 14b and the orthogonal driving stage 14c. The deflecting unit 14a directs the electron beam 10a to a target area of the second aperture plate 12, and cooperates with the orthogonal driving mechanism 14b and the orthogonal driving stage 14c so as to transfer a composite pattern image of an integrated circuit from the second aperture plate 12 to the electron resist layer 15a.

Figure 4A:
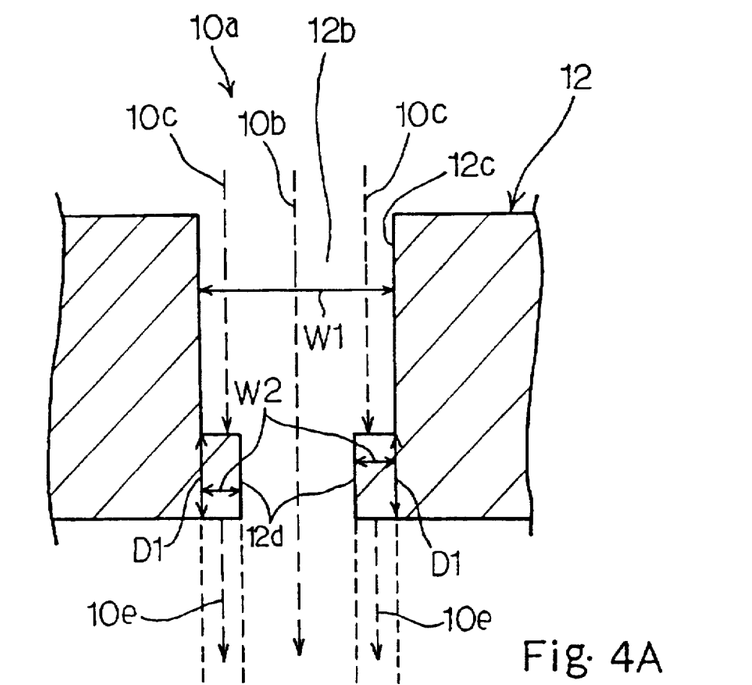
FIG. 4A is a cross sectional view showing a throughhole formed in a second aperture incorporated in the electron beam lithography system.

FIG. 4A illustrates a part of the second aperture plate 12, which is formed of silicon. The reason why the silicon is used is that the process conditions of silicon are well known so as to realize a miniature complex configuration. A plurality of patterns 12a are formed in the second aperture plate 12 (see FIG. 3), and the plurality of patterns form the composite pattern image. Each of the patterns 12a includes a plurality of apertures 12b, and one of the plurality of apertures 12b is shown in FIG. 4A.

The aperture 12b is different in cross section between an upper portion and a lower portion, because the second aperture plate 12 partially projects into the aperture 12b. A projection is not formed in the upper portion 12c of the second aperture plate 12, and the aperture 12b has a width W1. The electron beam 10a is incident into the aperture 12b, and is initially uniform in beam current density over the width W1. The lower portion 12d of the second aperture plate 12 inwardly projects by a width W2, and is D1 is thickness. The incident electron sub-beam 10b passes through the aperture 12b without interruption, and is incident into the electron resist layer 15a. However, the incident electron-sub-beam 10c falls onto the lower projecting portion 12d, and a transmission electron sub-beam 10e is incident into the electron resist layer 15a.

Figure 4B:
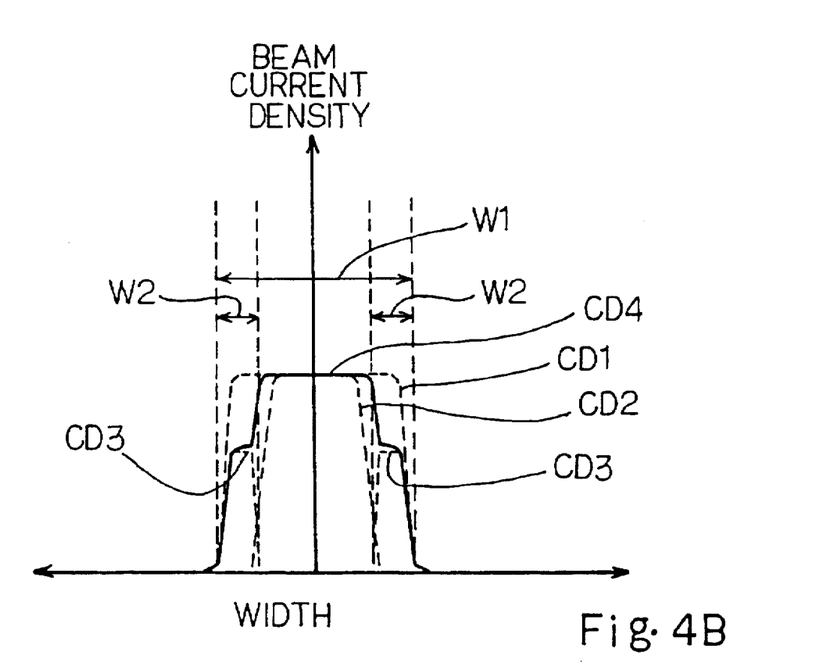
FIG. 4B is a graph showing a relation between a beam current density and a width of the through-hole.

FIG. 4B shows the beam current density falling onto the electron resist layer 15a. If the projection is not formed in the lower portion 12d, the beam current density is uniform as indicated by Plot CD1. However, the lower portion 12d decreases the local beam current density in a peripheral area on the electron resist layer 15a. More specifically, the electron sub-beam 10b is relatively large in beam current density, and Plots CD2 is indicative of the local beam current density of the electron sub-beam 10b. On the other hand, the transmission electron sub-beam 10e are relatively small in beam current density, because the electron sub-beam 10c loses a part of the energy during the transmission through the projection. For this reason, the local beam current density of the transmission electron sub-beam 10e is plotted by broken lines CD3. As a result, the electron beam incident into the electron resist layer 15a varies the beam current density along the width W1 as indicated by real line CD4.

The energy loss of the electron sub-beam 10c depends upon the thickness D1 and the width W2, and the profile of the transmission electron sub-beam 10e is controllable by changing an acceleration energy of the incident electron beam 10a and the density, the width W2 and the thickness D1 of the lower portion 12d of the second aperture plate 12.

The present inventor measured the transmittance of the electron beam. A silicon plate was shaped into the second aperture plate 12 having the lower portion 12d 10 microns thick, and radiated the electron beam 10a at 50 kilovolts. The transmission electron sub-beam 10e was about 30 per cent of the incident electron sub-beam 10c, and was plotted on a Gaussian distribution which was small in dispersion. This means that the amount of transmission electron beam 10e is controllable by changing the thickness D1.

Thus, the manufacturer can arbitrarily modify the current density profile of the electron beam incident into the electron resist layer 15a by changing the lower portion 12d of the second aperture plate 12. If the width W2 and the thickness D1 are appropriately designed, the second aperture plate 12 corrects the proximity effect of each pattern 12a, and the resolution on the electron resist layer 15a is surely improved.

The electron beam lithography system according to the present invention does not require a third aperture plate, and the projection incorporated in the second aperture plate is concurrently formed in the silicon plate together with the patterns 12A. For this reason, the manufacturer does not need to design and fabricate a current density controlling means separately from the second aperture plate 12. This results in reduction of the operating cost of the electron beam lithography system, and the manufacturer does not need to align the current density controlling means with the second aperture plate.

Moreover, the aperture 12b is much wider than the screen mesh, and dust particles hardly clog the aperture 12b.

Second Embodiment

Figure 5A:
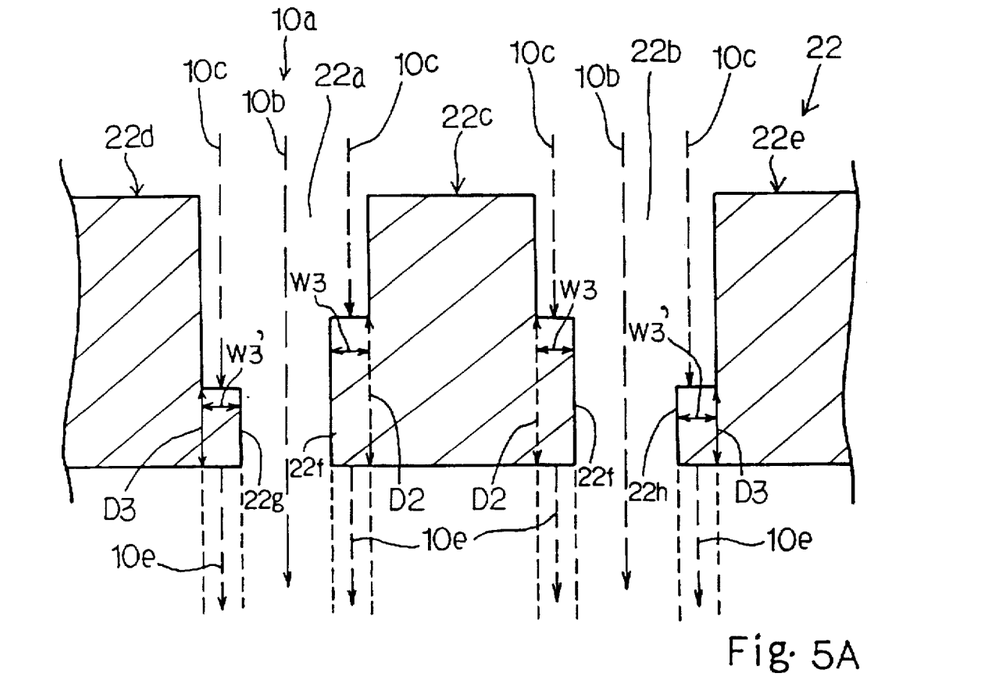
FIG. 5A is a cross sectional view showing a part of another second aperture plate incorporated in the electron beam lithography system.

Turning to FIG. 5A of the drawings, a second aperture plate 22 is incorporated in the electron beam lithography system shown in FIG. 3. Even though not shown in FIG. 5A, reference numerals and reference symbols are used for the parts and the beams already described in the following description.

A plurality of apertures 22a and 22b are formed in the second aperture plate 22 of silicon, and are close to one another. In this embodiment, in aperture 22a there is a first projecting portion 22g and a second projecting portion 22f. The second aperture 22b contains the second projecting portion 22f and a third projecting portion 22h. The proximity effect is strong under an intermediate block 22c more than under a left block 22d and a right block 22e. For this reason, the lower projecting 22f of the intermediate block 22c is thicker than the lower projecting portion 22g of the left block 22d and the lower portion 22h of the right block 22e.

Figure 5B:
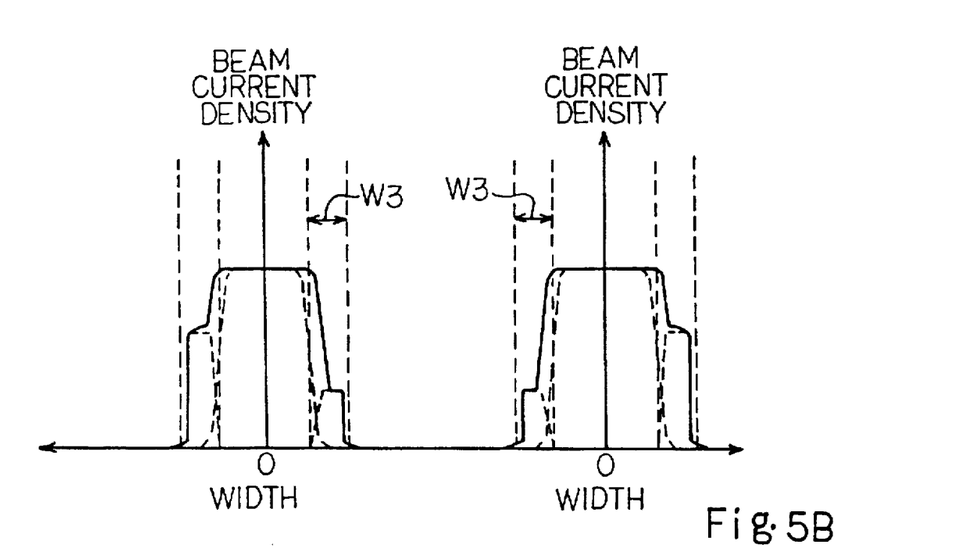
FIG. 5B is a graph showing beam current density profiles incident through the second aperture plate to an electron resist layer.

The electron sub-beams 10b and 10e passing through the left and right apertures 22a and 22b form respective profiles of the beam current density as shown in FIG. 5B, and the profiles are not symmetric due to the difference between the thickness D2 and the thickness D3. The transmission electron beam 10e through the lower portion 22f is extremely small in the beam current density, and the proximity effect is effectively corrected by virtue of the thick lower portion 22f.

The width W3 and the thickness D2, the width W3' and the thickness D3 and the ratio between the thicknesses D2 and D3 are regulated in such a manner as to prevent the electron resist layer 15a from the proximity effect, and are varied depending upon the aperture pattern.

The electron beam lithography system equipped with the second aperture plate 22 achieves all the advantages of the first embodiment.

Third Embodiment

Figure 6A:
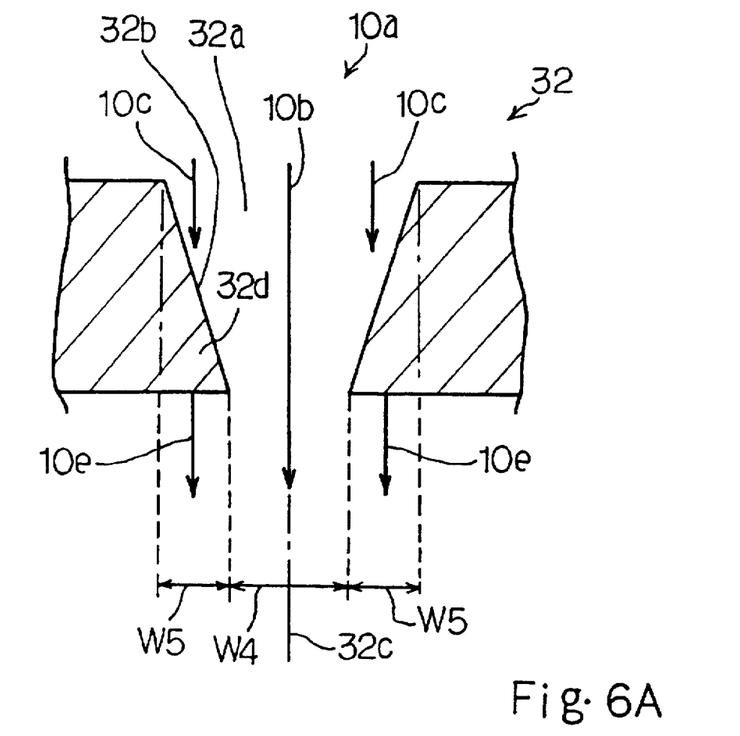
FIG. 6A is a cross sectional view showing a part of yet another second aperture plate incorporated in the electron beam lithography system.
Figure 6B:
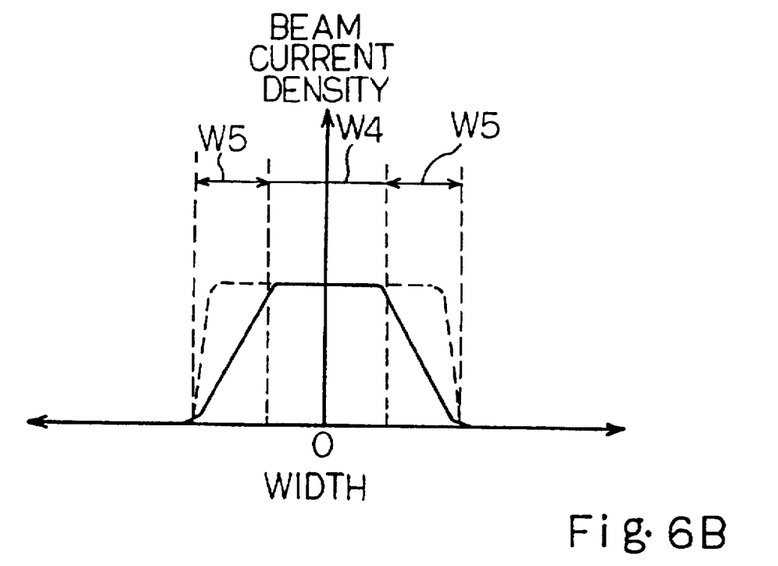
FIG. 6B is a graph showing beam current density profiles incident through the second aperture plate to an electron resist layer.

Turning to FIG. 6A of the drawings, yet another second aperture plate 32 of silicon has an aperture 32a, and the aperture 32a is defined by an tapered inner wall 32b oblique to a center line 32c of the aperture 32a. The inner edge portion 32d gradually decreases the cross-sectional area of the aperture 32a from an inlet end to an outlet end, and the transmission electron sub-beam 103 is gradually decreased in inverse proportion to the distance from the center line 32c. As a result, the beam current density of the incident electron beam forms a trapezoid shaped profile as shown in FIG. 6B, and the profile is the most appropriate for correcting the proximity effect.

The angle of the inner wall 32b with respect to the center line 32c is regulated in such a manner as to prevent the electron resist layer 15a from the proximity effect, and is varied depending upon the aperture pattern.

In this instance, the inner wall 32b are flat. However, the inner wall 32b may be a curved surface.

The second aperture plate 32 causes the electron beam lithography system to achieve all the advantages described in conjunction with the first embodiment.

Fourth Embodiment

Figure 7A:
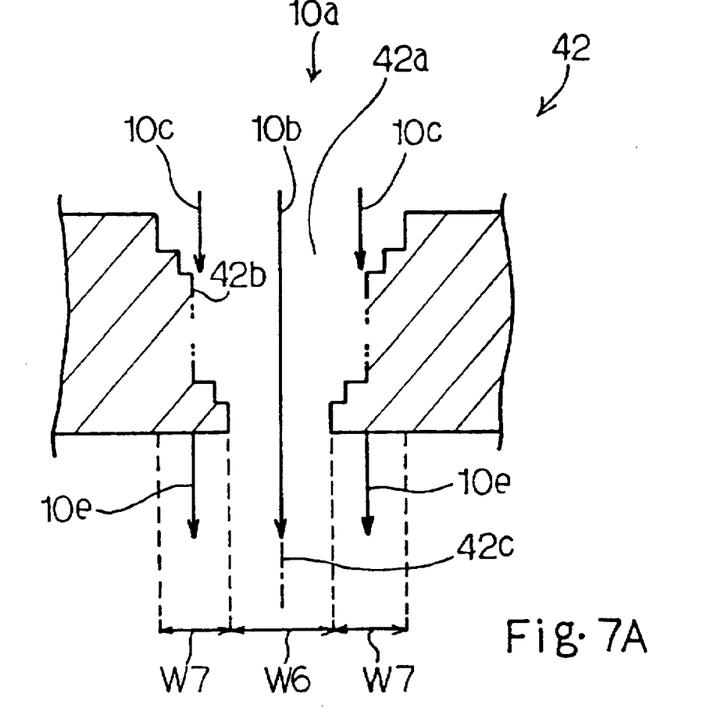
FIG. 7A is a cross sectional view showing a part of still another second aperture plate incorporated in the electron beam lithography system.
Figure 7B:
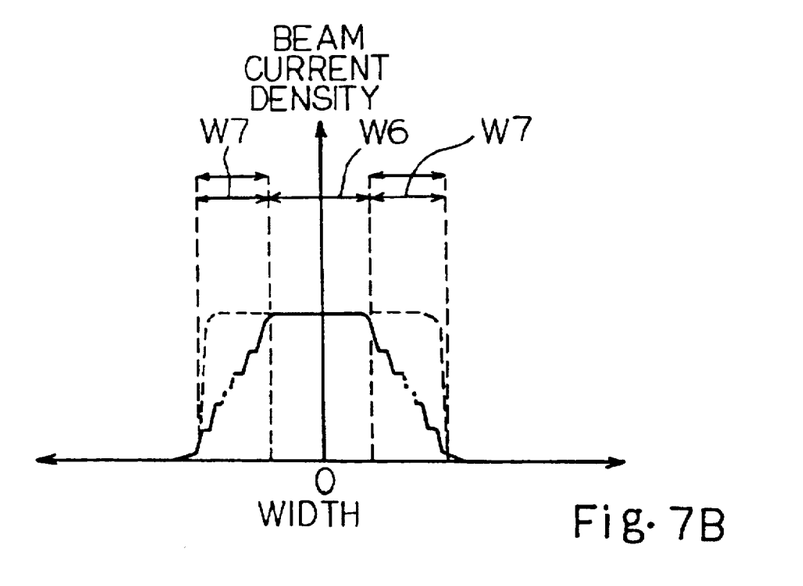
FIG. 7B is a graph showing beam current density profiles incident through the second aperture plate to an electron resist layer.

Turning to FIG. 7A of the drawings, still another second aperture plate 42 of silicon has an aperture 42a. The aperture 42a is defined by a stepped inner wall 42b, and the stepped inner wall 42b has a plurality of micro-steps. The micro-steps gradually decreases the amount of area of the aperture 42a and, accordingly, the beam current density in inverse proportion to the distance from a center line 42c. As a result, the beam current density forms a generally trapezoid profile as shown in FIG. 7B, and is close to the most appropriate profile in view of the resolution. However, the tapered inner wall 32b is time-consuming in the fabrication process, and the second aperture plate 32 is rather expensive than the second aperture plate 42. The stepped inner wall 42b is easily formed by repeating etching stages, and the second aperture plate 42 is a compromise between the resolution and the production cost.

Of course, if the micro-steps are increased, the profile of the incident electron beam becomes closer to the most appropriate linear profile. However, the production cost is increased, and the manufacturer may balances the production cost and the resolution.

The width W7 and the thickness of each micro-steps are varied depending upon the aperture pattern.

Although particular embodiments of the present invention have been shown and described, it will be obvious to those skilled in the art that various changes and modifications may be made without departing from the spirit and scope of the present invention. For example, the lens system 13 may be appropriately modified, and a pattern formed in the second aperture plate 12 may be constituted by arbitrarily shaped aperture or transparent block.

What is claimed is:

1. A method of forming a pattern in an electron resist layer by electron beam lithography, said method comprising the steps of:

selecting an aperture plate having said pattern formed by at least one first aperture therein, said at least one first aperture having a first projection adjacent to an outlet end of said at least one first aperture to render the aperture narrower at said outlet end when compared to an inlet end of said at least one first aperture, said selecting step including providing a second aperture in said aperture plate in proximity to said at least one first aperture and separated therefrom by an intermediate block, said second aperture having another projection located adjacent to an outlet end of said another aperture, said another projection rendering said outlet end of said another aperture narrower than an inlet end of said another aperture, said first projection having a first projecting portion spaced from said intermediate block and a second projecting portion abutting said intermediate block, and said another projection having a third projecting portion spaced from said intermediate body and a fourth projecting portion abutting said intermediate body, said second and fourth projecting portions being thicker than said first and said third projecting portions;

locating said aperture plate in a path of an electron beam, said aperture plate being arranged between an electron beam gun and said electron resist layer; and radiating the electron beam with an incident beam current density through said inlet end of said at least one first aperture, said electron beam partially passing through said outlet end and partially being transmitted through said first projection so that an emergent beam current density of the electron beam that impinges on the electron resist layer is smaller in a peripheral area of said electron beam as compared to a central area thereof so that said first projection corrects proximity effects in the pattern.

2. The method as set forth in claim 1, including the step of selecting the thicknesses of said first to forth projecting portions and widths of said first to forth projecting portions in such a manner as to control the emergent beam current density and thus correct said electron resist layer from a proximity effect in said pattern.

3. A method of forming a pattern in an electron resist layer by electron beam lithography, said method comprising the steps of:

selecting an aperture plate having said pattern formed by at least one first aperture therein, said at least one first aperture having a first projection adjacent to an outlet end of said at least one first aperture to render the aperture narrower at said outlet end when compared to an inlet end of said at least one first aperture, said at least one first aperture being defined by an inner wall which extends on opposite sides of a center line of said at least one first aperture so that said inlet end portion is joined with said outlet end portion via said inner wall, said inner wall being parallel to said center line;

locating said aperture plate in a path of an electron beam, said aperture plate being arranged between an electron beam gun and said electron resist layer; and radiating the electron beam with an incident beam current density through said inlet end of said at least one first aperture, said electron beam partially passing through said outlet end and partially being transmitted through said first projection so that an emergent beam current density of the electron beam that impinges on the electron resist layer is smaller in a peripheral area of said electron beam as compared to a central area thereof so that said first projection corrects proximity effects in the pattern.

4. A method of forming a pattern in an electron resist layer by electron beam lithography, said method comprising the steps of:

selecting an aperture plate having said pattern formed by a plurality of apertures disposed side-by-side to each other, at least one aperture of said plurality of apertures having at a side next to another of said plurality of apertures adjacent to said at least one aperture, said aperture plate having a projection adjacent to an outlet end of said at least one aperture to render the aperture narrower at said outlet end when compared to an inlet end of said at least one first aperture, said projection being defined by a plurality of micro-steps which are arranged to gradually narrow said at least one aperture toward said outlet ends;

locating said aperture plate in a path of an electron beam, said aperture plate being arranged between an electron beam gun and said electron resist layer; and simultaneously radiating said plurality of apertures with the electron beam, said electron beam having an incident beam current density through said inlet end of said at least one aperture, said electron beam partially passing through said outlet end and partially being transmitted through said projection so that an emergent beam current density of the electron beam that impinges on the electron resist layer is smaller in a peripheral area of said electron beam as compared to a central area thereof so that said projection corrects proximity effects in the pattern.

5. The method as set forth in claim 4, in which a distance between one of said micro-steps closest to said inner end portion and another of said micro-steps farthest from said inner portion, measured perpendicularly to a center axis of said at least one aperture is set so as to control the emergent beam current density and thus correct said electron resist layer from a proximity effect in said pattern.

* * * * *